(12) United States Patent
Coquand et al.

(10) Patent No.: US 10,109,735 B2
(45) Date of Patent: Oct. 23, 2018

(54) PROCESS FOR FABRICATING A FIELD EFFECT TRANSISTOR HAVING A COATING GATE

(71) Applicant: Commissariat a l'energie atomique et aux energies alternatives, Paris (FR)

(72) Inventors: Remi Coquand, Les Marches (FR); Emmanuel Augendre, Montbonnot (FR); Shay Reboh, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 15/730,923

(22) Filed: Oct. 12, 2017

(65) Prior Publication Data

US 2018/0182893 A1 Jun. 28, 2018

(30) Foreign Application Priority Data

Oct. 13, 2016 (FR) .................................. 16 59941

(51) Int. Cl.
*H01L 29/06* (2006.01)
*H01L 21/02* (2006.01)
(Continued)

(52) U.S. Cl.
CPC ........ *H01L 29/7847* (2013.01); *H01L 21/266* (2013.01); *H01L 21/2652* (2013.01);
(Continued)

(58) Field of Classification Search
None
See application file for complete search history.

(56) References Cited

U.S. PATENT DOCUMENTS

2014/0131660 A1 5/2014 Cea et al.
2015/0372115 A1 12/2015 Koh et al.
(Continued)

FOREIGN PATENT DOCUMENTS

| EP | 3 070 744 A1 | 9/2016 |
| WO | WO 2013/095652 A1 | 6/2013 |
| WO | WO 2015/050546 A1 | 4/2015 |

OTHER PUBLICATIONS

French Preliminary Search Report dated Jul. 3, 2017 in French Application 16 59941 filed on Oct. 13, 2016 (with English Translation of Categories of Cited Documents and Written Opinion).

*Primary Examiner* — Asok K Sarkar
(74) *Attorney, Agent, or Firm* — Oblon, McClelland, Maier & Neustadt, L.L.P.

(57) ABSTRACT

A process for fabricating a gate-wrap-around field-effect transistor is provided, including: providing a superposition of first to third nanowires, each made of a semiconductor, the second nanowire being subjected to a strain along its longitudinal axis, a median portion of the first to third nanowires being covered by a sacrificial gate; forming voids by removing a portion of the first and third nanowires that is intermediate between their ends and their median portion, while preserving the superposition of the first to third nanowires level with the ends and under the sacrificial gate; forming an electrical insulator in the voids around the second nanowire; removing the sacrificial gate and the median portion of the first and third nanowires; and forming a gate electrode wrapped around the median portion of the second nanowire.

12 Claims, 7 Drawing Sheets

(51) Int. Cl.
*H01L 29/78* (2006.01)
*H01L 29/10* (2006.01)
*H01L 21/265* (2006.01)
*H01L 29/66* (2006.01)
*H01L 29/40* (2006.01)
*H01L 21/266* (2006.01)
*H01L 29/167* (2006.01)
*H01L 29/165* (2006.01)
*H01L 29/16* (2006.01)
*H01L 21/306* (2006.01)
*H01L 21/311* (2006.01)

(52) U.S. Cl.
CPC ...... *H01L 29/0653* (2013.01); *H01L 29/0673* (2013.01); *H01L 29/1033* (2013.01); *H01L 29/165* (2013.01); *H01L 29/167* (2013.01); *H01L 29/1608* (2013.01); *H01L 29/40* (2013.01); *H01L 29/6653* (2013.01); *H01L 29/6681* (2013.01); *H01L 29/66545* (2013.01); *H01L 29/66553* (2013.01); *H01L 29/7848* (2013.01); *H01L 29/7853* (2013.01); *H01L 21/0228* (2013.01); *H01L 21/02126* (2013.01); *H01L 21/02167* (2013.01); *H01L 21/30604* (2013.01); *H01L 21/31111* (2013.01)

(56) References Cited

U.S. PATENT DOCUMENTS

| | | |
|---|---|---|
| 2016/0027870 A1 | 1/2016 | Cheng et al. |
| 2016/0049489 A1* | 2/2016 | Wan ............... H01L 29/42392 257/347 |
| 2016/0079360 A1 | 3/2016 | Cea et al. |
| 2016/0211322 A1 | 7/2016 | Kim et al. |
| 2016/0254382 A1* | 9/2016 | Hoentschel ......... H01L 29/7851 257/401 |
| 2016/0276494 A1 | 9/2016 | Barraud et al. |
| 2017/0040323 A1* | 2/2017 | Lee ................... H01L 29/1033 |
| 2017/0047405 A1 | 2/2017 | Cea et al. |
| 2017/0047452 A1 | 2/2017 | Kim et al. |
| 2017/0110374 A1* | 4/2017 | Xu ................. H01L 21/823431 |
| 2017/0110541 A1* | 4/2017 | Xu ..................... H01L 29/0673 |
| 2017/0194213 A1* | 7/2017 | Ching ............. H01L 21/823821 |
| 2018/0090570 A1* | 3/2018 | Peng ................. H01L 29/0673 |

* cited by examiner

PROCESS FOR FABRICATING A FIELD EFFECT TRANSISTOR HAVING A COATING GATE

TECHNICAL FIELD

The invention relates to gate-wrap-around field-effect transistors, and in particular to processes for fabricating such transistors.

The increase in the performance of integrated circuits due to the miniaturization of field-effect transistors is confronted with a scientific and technological obstacle. One of the underlying problems is the increase in static and dynamic power in integrated circuits. In order to decrease this consumed power, new architectures and new materials that will allow a low operating voltage to be obtained are being intensively studied at the present time.

In particular, for technological nodes under 50 nm, electrostatic control of the channel by the gate becomes a key operating parameter with respect to the operation of the transistor. To improve this electrostatic control, various multiple-gate transistor technologies are being developed, in particular gate-wrap-around transistors. Moreover, it is known to compressively strain the channels of pMOS transistors or to tensilely strain the channels of nMOS transistors in their conduction direction, so as to improve the mobility of the carriers in these channels.

The following is a known process for fabricating a pMOS gate-wrap-around transistor. A stack of nanowires comprising in alternation silicon nanowires and silicon-germanium nanowires on a substrate is formed, so as to for example obtain compressively strained SiGe nanowires and relaxed silicon nanowires. A sacrificial gate is formed to cover the median portion of the stack of nanowires. Insulating spacers are also formed on either side of the sacrificial gate, in order to cover an intermediate median portion of the stack of nanowires. The channels of the transistor are intended to be formed in this median portion. Those portions of the nanowires of the stack which protrude beyond the spacers are not covered and are removed by etching. The SiGe nanowires are then relaxed and the silicon nanowires are then subject to a tensile strain.

The portion of the silicon-germanium nanowires under the spacers is removed by selective etching, so as to form cavities under these spacers. Internal spacers are then deposited in the interior of the cavities. In a step of growing silicon-germanium epitaxially, a source and a drain are formed on either side of the stack. The source and the drain formed by epitaxy then make contact and are in continuity with the silicon nanowires that were preserved under the sacrificial gate and the spacers. The source and drain are then encapsulated in an encapsulating or passivating material. A groove is then formed level with the sacrificial gate and the sacrificial gate is removed. The residual stack of nanowires is then uncovered. By selective etching, the silicon-germanium nanowires are removed. A gate insulator is then deposited on the uncovered portion of the silicon nanowires, then a gate material is formed on the gate insulator in order to encapsulate the median portion of these nanowires. At the end of this fabricating process, the silicon nanowires remain slightly tensilely strained in the channel, this degrading the performance of the pMOS transistor.

Similarly, for an sSOI nMOS transistor or a transistor based on an SRB layer, a similar fabricating process leads to a relaxation of the silicon of the channel, despite an initial tensile prestrain in the silicon nanowires. The performance of such an nMOS transistor is therefore degraded.

The subsequent formation of the source and drain by epitaxy does not allow the desired strain to be obtained in the channel zone of the silicon nanowires.

There is therefore a need for a process for fabricating a gate-wrap-around field-effect transistor intended to maintain a significant prestrain in its channels. The invention aims to overcome one or more of these drawbacks. Thus, the invention relates to a process for fabricating a gate-wrap-around field-effect transistor such as defined in the appended claims.

BRIEF DESCRIPTION OF THE DRAWINGS

Other features and advantages of the invention will emerge clearly from the description thereof that is given hereinafter, by way of indication and without limitation, with reference to the appended drawings, in which.

DETAILED DESCRIPTION

The invention provides a process for fabricating a gate-wrap-around field-effect transistor allowing, on the one hand, internal spacers to be formed when nanowires that extend from a source zone to a drain zone and include a channel zone are preserved, and, on the other hand, allowing a high prestrain to be maintained in the interior of these channel zones. Generally, a tensile prestrain will be maintained in the channel zone of an nMOS transistor and a compressive prestrain in the channel zone of a pMOS transistor.

FIGS. 1 to 22 illustrate a transistor 1 in various steps of its fabricating process, according to one example embodiment of the invention. The steps described with reference to FIGS. 1 to 5 are known per se by those skilled in the art and given by way of nonlimiting example of how to obtain a superposition of nanowires with a sacrificial gate.

Figure 1:
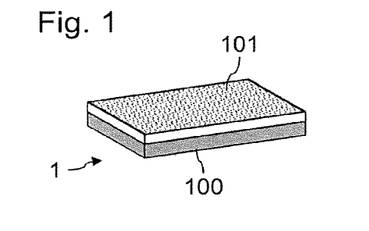
FIGS. 1 to 22 illustrate a transistor during various steps of its fabricating process, according to one example of a first embodiment of the invention.

FIG. 1 shows a substrate, illustrated in perspective. The substrate may for example be an sSOI substrate (sSOI standing for strained silicon-on-insulator) or an SRB substrate (SRB standing for strain relaxed buffer), in a way known per se. The substrate is here a semiconductor-on-insulator substrate. The substrate here comprises an insulating layer 100 covered with a semiconductor layer 101. The semiconductor layer 101 is here a relaxed SiGe layer. For an SRB substrate, the insulating layer 100 will for example be replaced with a relaxed SiGe layer covered with a silicon layer typically strained with a biaxial tensile strain.

Figure 2:
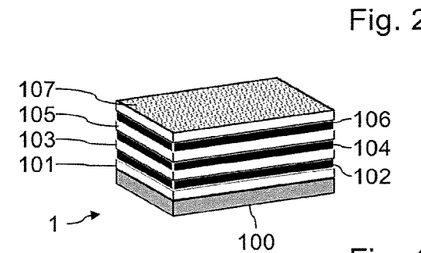

In FIG. 2, a superposition of layers 102 to 107 has been formed on the SiGe layer 101. Thus an alternation of SiGe layers 101, 103, 105 and 107, and silicon layers 102, 104 and 106 has been formed. The layers 102 to 107 are typically formed in sequential steps of epitaxial deposition. As is known per se, because of differences in lattice parameters between the silicon layers 102, 104 and 106, and the SiGe layers 101, 103, 105 and 107, a tensile strain is induced in the layers made of silicon 102, 104 and 106.

The thickness of the layers 101, 103, 105 and 107 is for example comprised between 5 and 15 nm and is preferably at most 10 nm. This thickness is for example 7 nm. The thickness of the layers 102, 104 and 106 is for example comprised between 5 and 15 nm and is preferably at most 10 nm. This thickness is for example 9 nm.

Figure 3:
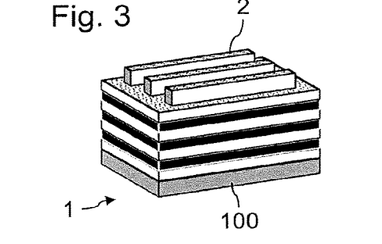
Figure 4:
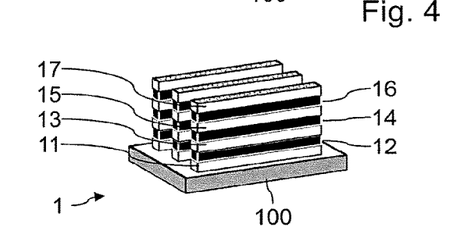

In FIG. 3, a mask 2 has been formed on the superposition of the layers 101 to 107, for example by photolithography. In FIG. 4, the layers 101 to 107 have been etched so as to form superpositions or stacks of adjacent nanowires. Each superposition or stack of nanowires includes a superposition of nanowires 11 to 17. The nanowires 11 to 17 extend in a longitudinal direction, and thus have a length at least two times larger than their width or their height. The nanowires 11, 13, 15 and 17 are here made of SiGe, for example $Si_{(1-x)}Ge_x$ where $0.2<x<0.6$. The value $x=0.3$ may for example be taken. The nanowires 12, 14 and 16 are here made of silicon. The mask 2 has been removed from the stacks. The width of each stack is for example comprised between 10 and 50 nanometers. The stacks of nanowires here include 7 superposed nanowires. A different number of superposed nanowires may of course be used. The height of the stacks of nanowires is for example comprised between 30 and 100 nanometers.

Figure 5:
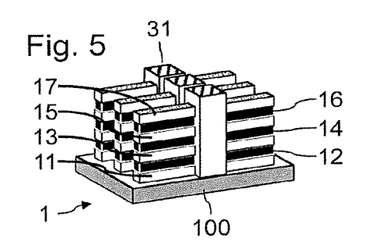

In FIG. 5, a sacrificial gate 31 has been formed for each of the stacks of nanowires. Each sacrificial gate 31 is wrapped around the median portion of a respective stack of nanowires. The sacrificial gate 31 for example comprises a protective layer of a thickness comprised between 1 nm and 3 nm of $SiO_2$ making contact with the nanowires, this layer being covered by a layer of poly-Si. The sacrificial gate 31 may also be formed (nonlimitingly) by a single layer of $SiO_2$. The process for forming and shaping each sacrificial gate 31 is known per se. The gate length of a transistor to be formed is defined by the length over which a sacrificial gate 31 is wrapped around a respective stack of nanowires.

Figure 6:
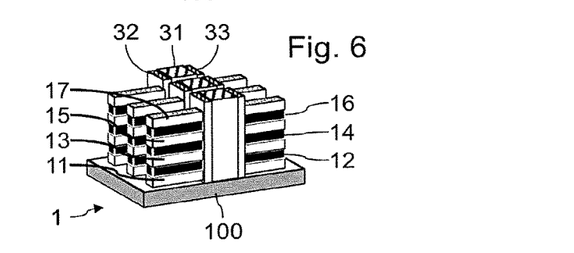

In FIG. 6, sacrificial spacers 32 and 33 have been formed on either side of each of the sacrificial gates 31. The sacrificial spacers 32 are each wrapped around a respective stack of nanowires level with its median portion, on one side of a respective sacrificial gate 31. The sacrificial spacers 33 are each wrapped around a respective stack of nanowires level with its median portion, on the other side of a respective sacrificial gate 31. The process for forming and shaping each sacrificial spacer 32, 33 is known per se. The width of each of the sacrificial spacers 32 or 33 is for example comprised between 3 and 15 nm. The sacrificial spacers 32, 33 are for example made of dielectric. The sacrificial spacers 32 or 33 are for example made of SiN, SiOCH or of SiBCN. The ends of the stacks of nanowires remain exposed.

Figure 7:
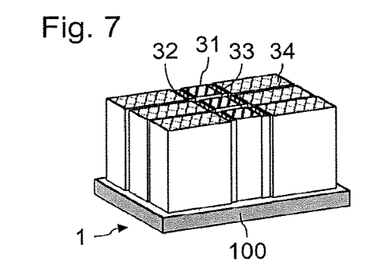
Figure 8:
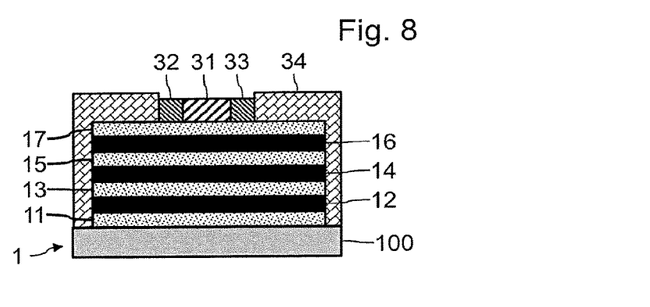

In FIG. 7, the ends of the nanowires have been encapsulated in an encapsulating material 34 using a deposition process that is known per se. An access is provided to the upper face of the sacrificial gates 31 and to the upper face of the sacrificial spacers 32 and 33. FIG. 8 is a longitudinal cross-sectional view level with one of the stacks of nanowires. At this stage, the nanowires 11 to 17 are preserved in their entirety, under the passivating material 34, under the sacrificial spacers 32 and 33, and under the sacrificial gate 31. Because of the continuity of these nanowires between their ends, over the entire stack, the tensile strains induced in the silicon nanowires 12, 14, 16 and 18 are preserved.

Figure 9:
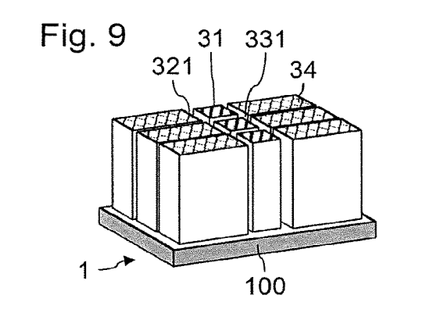
Figure 10:
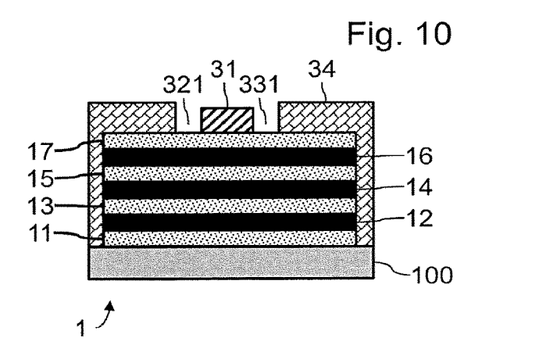

In FIG. 9, a step of removing the sacrificial spacers 32 and 33 has been carried out. This removal is here achieved by selectively etching the sacrificial spacers 32 and 33. For sacrificial spacers 32 and 33 made of SiN, the removal may for example be achieved by wet etching with orthophosphoric acid ($H_3PO_4$). Grooves 321 and 331 are thus formed on either side of each of the sacrificial gates 31. As better illustrated in FIG. 10, an intermediate median portion of the stacks of nanowires is thus exposed, on either side of the sacrificial gates 31.

Figure 11:
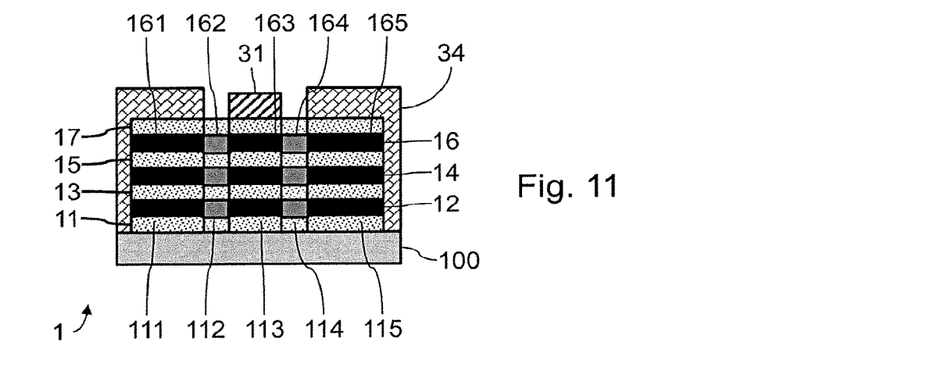

In FIG. 11, the exposed portions of the nanowires plumb with the grooves 321 and 331 are here subjected to ion implantation, other chemical consumption methods being detailed below. It is possible for example to perform an ion implantation of silicon, with a view to making the exposed SiGe amorphous, or at least to make it richer in defects. The ion implantation here aims to make the SiGe nanowires 11, 13, 15 and 17 amorphous or to modify their crystal lattice plumb with the grooves 321 and 331. Each nanowire 11 to 17 is then disassociated between:

a first end housed under the passivating material 34. This first end is not impacted (or if it is, only marginally) by the ion implantation step;

an intermediate portion that is exposed in the groove 321. This intermediate portion corresponds to the reference 112 for the SiGe nanowire 11. This intermediate portion corresponds to the reference 162 for the silicon nanowire 16;

an intermediate channel portion that is lodged under the sacrificial gate 31. This intermediate portion is not impacted (or if it is, only marginally) by the ion implantation step. This intermediate portion corresponds to the reference 113 for the SiGe nanowire 11. This intermediate portion corresponds to the reference 163 for the silicon nanowire 16;

an intermediate portion that is exposed in the groove 331. This intermediate portion corresponds to the reference 114 for the SiGe nanowire 11. This intermediate portion corresponds to the reference 164 for the silicon nanowire 16;

a second end lodged under the passivating material 34. This second end is not impacted (or if it is, only marginally) by the ion implantation step. This second end corresponds to the reference 115 for the SiGe nanowires 11. This second end corresponds to the reference 165 for the silicon nanowire 16.

The zones of the SiGe that were subject to the ion implantation then become particularly sensitive to subsequent selective etching. The ion implantation here takes advantage of the different amorphization thresholds of silicon and germanium. The ion implantation thus allows the intermediate portions of the SiGe nanowires to be amorphized without resulting in an amorphization of the intermediate portions of the silicon nanowires.

In order to implant ions into the intermediate portions of the SiGe nanowires at various levels in the stack, the ion implantation may be carried out in a plurality of steps, with different ionization energies. The ionization energies will for example be designed to achieve a peak of defects at the level of a targeted respective intermediate portion of an SiGe nanowire. It is for example possible to envision an ion implantation on the basis of Si, P, Ar and Ge.

Figure 12:
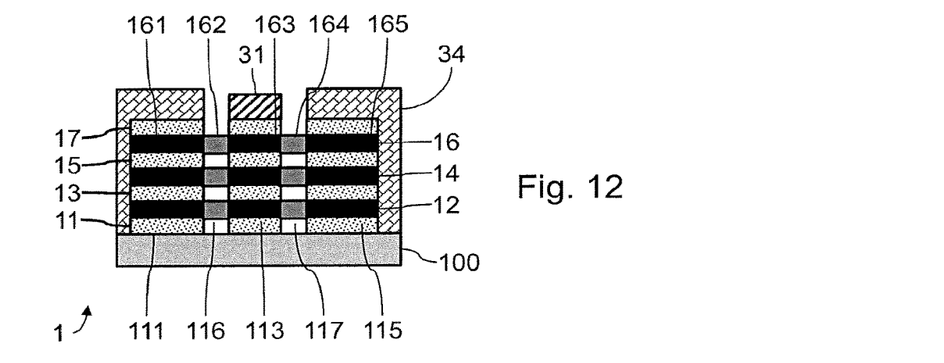

In FIG. 12, intermediate portions of the SiGe nanowires 11, 13, 15 and 17 have been removed. This removal is achieved by selectively etching the SiGe which has been made amorphous, plumb with the grooves 321 and 331. The ends and the median portion of the SiGe nanowires 11, 13, 15 and 17 remained masked by the passivating material 34 and the sacrificial gate 31 and thus were not affected by the ion implantation, the etching of the SiGe of the intermediate portions being very selective. The removed intermediate portions of the SiGe nanowires 11, 13, 15 and 17 leave behind voids. The nanowire 11 thus includes voids 116 and 117 on either side of its median portion 113. The nanowire 16 thus includes voids above and below its intermediate portions 162 and 164.

Advantageously, the intermediate portions of the silicon nanowires 12, 14 and 16 may be doped after the intermediate portions of the SiGe nanowires 11, 13, 15 and 17 have been removed. Appropriate doping of the intermediate portions of the silicon nanowires allows the electrical performance of the transistors to be formed to be improved. Such doping may for example be carried out by plasma immersion or by an ion-rich deposition able to diffuse into the intermediate portions of the silicon nanowires.

Figure 13:
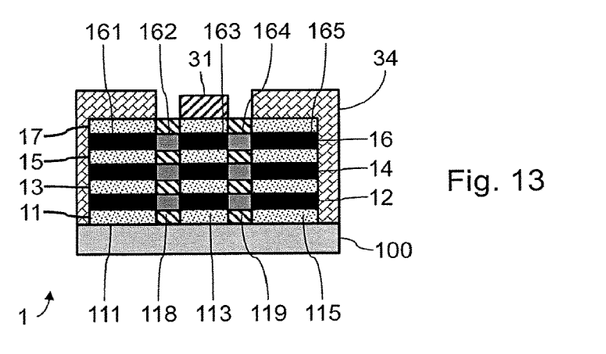

In FIG. 13, the voids produced beforehand have been at least partially filled with a dielectric, so as to form internal spacers. Thus, the voids 116 and 117 of the nanowire 11 are here replaced by internal spacers 118 and 119. Advantageously, it is also possible to fill the voids formed only partially, so as to preserve an air gap. Such partial filling may for example be achieved by atomic layer deposition (ALD). Such air gaps allow the dielectric constant of the spacers to be decreased. Such partial filling nonetheless allows a material to be kept between the air and the median portion under the gate in order to prevent this cavity from being filled in subsequent steps. Each intermediate portion of a silicon nanowire 12, 14 or 16 is thus placed between two internal spacers in a direction normal to the substrate 100. The internal spacers are made of dielectric, for example of a low-dielectric-constant dielectric (dielectric constant typically lower than 4). The internal spacers are for example made of SiBCN or SiOCH. The internal spacers are typically made from a material that etches very selectively with respect to the other materials used to form the transistor (for example polysilicon and TiN for the gate, $SiO_2$ for the passivating/encapsulating material, etc.).

Figure 14:
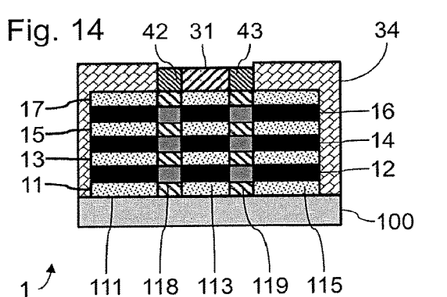
Figure 15:
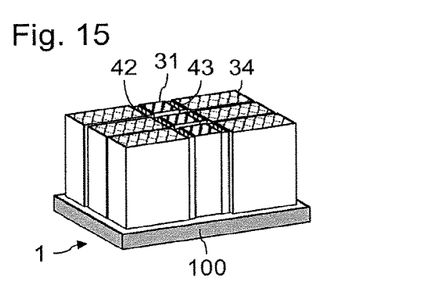

In FIGS. 14 and 15, spacers 42 and 43, provided on either side of the sacrificial gate 31, have been wrapped around the intermediate portions of the nanowires and the dielectric spacers. The spacers 42 and 43 are advantageously made of a low-dielectric-constant dielectric. The spacers 42 and 43 are for example made of SiBCN or SiOCH. Consequently, an insulation has been created between the sacrificial gate 31 and the ends of the stacks of nanowires. As a variant, it is also possible to form the spacers 42 and 43 from the same material and in the same processing phase as the internal spacers.

Figure 16:
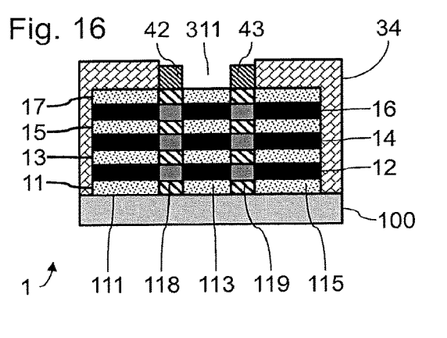
Figure 17:
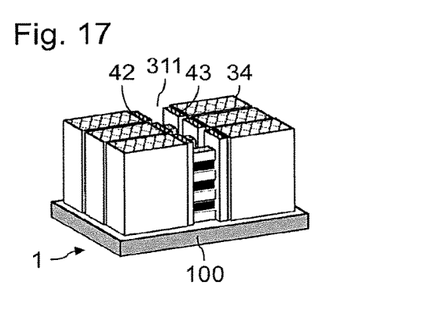

In FIGS. 16 and 17, the sacrificial gate 31 has been removed in order to produce a groove 311 and thus an access to the median portions of the nanowires 11 to 17. The removal of the sacrificial gate 31 is for example achieved using an etch that is selective with respect to the material of the spacers 42 and 43. The sacrificial gate is for example removed with an ammonia-solution-based chemistry (for example TMAH, for example to remove a poly-Si selectively with respect to an oxide that protects the nanowires where appropriate, and with respect to the nitrides of the spacers where appropriate).

Figure 18:
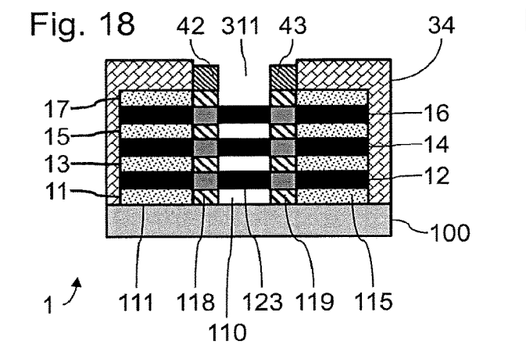
Figure 19:
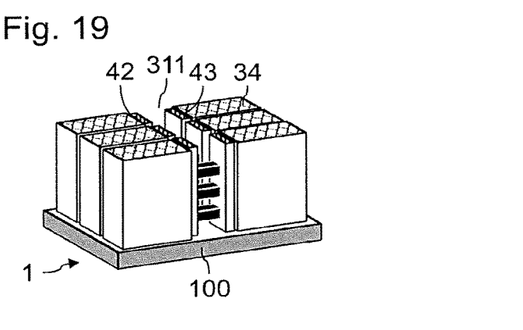

In FIGS. 18 and 19, the median portion of the nanowires 11, 13, 15 and 17 have been removed selectively while preserving the median portion of the nanowires 12, 14 and 16. The step of selectively removing the median portion of the nanowires 11, 13, 15 and 17 may implement the selective etching process detailed above with respect to the etching of the intermediate portions of the nanowires 11, 13, 15 and 17. Thus, the median portion of the nanowires 11, 13, 15 and 17 made of SiGe is selectively removed with respect to the median portion of the nanowires 12, 14 and 16 made of silicon.

The median portion of the nanowires 12, 14 and 16 corresponds to the channel zones of the gate-wrap-around transistor in the process of being formed. For example, the median portion 113 of the nanowire 11 has been replaced by a void 110. Thus, an access to all the faces of the median portions of the nanowires 12, 14 and 16 is formed. The internal spacers 118 and 119, and the spacers 42 and 43 allow the intermediate median portions of the nanowires 12, 14 and 16 to be protected during this selective etching.

At the end of the removal of the intermediate median portion of the nanowires 11, 13, 15 and 17, the ends of the nanowires 11 to 17 are preserved so that a longitudinal tensile strain is maintained in the median portion of the nanowires 12, 14 and 16.

Figure 20:
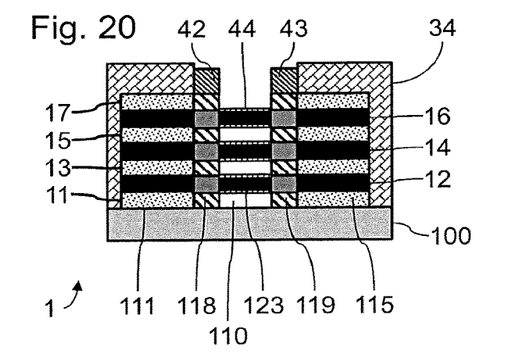

In FIG. 20, a gate insulator 44 has been formed around the median portions of the nanowires 12, 14 and 16. The gate insulator of each nanowire 12, 14 and 16 may for example comprise an interfacial oxide layer making contact with the nanowire, which layer is surmounted with an oxide layer wrapped around this interfacial layer. The wrap-around oxide layer may for example be made of $HfO_2$. Processes for forming the gate insulator 44 are known per se by those skilled in the art.

Figure 21:
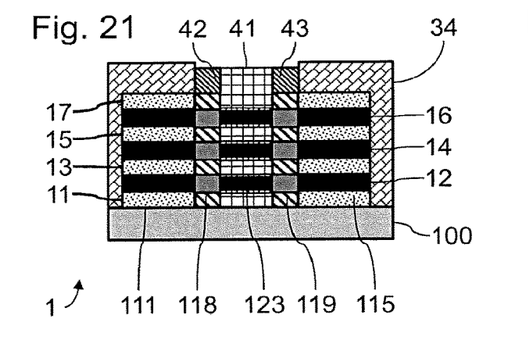
Figure 22:
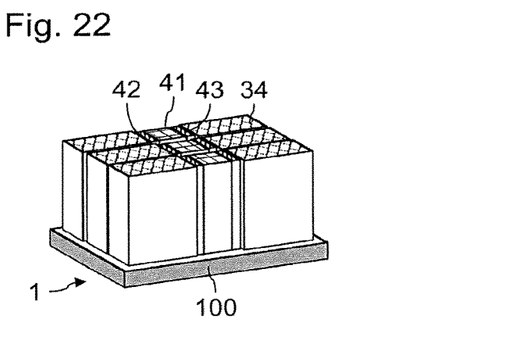

In FIGS. 21 and 22, a wrap-around gate 41 has been formed by filling the voids encircling the intermediate portions of the nanowires 12, 14 and 16 and the gate insulators 44. The wrap-around gate 41 may for example be produced in a way known per se by depositing a gate metal and/or by depositing highly doped polysilicon.

Because of the preservation of the ends of the nanowires 11 to 17 up to the formation of the spacers 42, 43 and the gate 44, it is possible to maintain a significant tensile strain in the median portions of the nanowires 12, 14 and 16 at this stage of the fabricating process. Since this median portion of the nanowires 12, 14 and 16 corresponds to the channel zone to be formed, the performance of an nMOS transistor thus formed is improved.

According to one variant, it is possible to increase the value of the tensile strain in the median portions of the nanowires 12, 14 and 16, in order to improve the electrical performance of the nMOS transistor.

To this end, the fabricating process described above with reference to FIGS. 1 to 15 may be implemented.

Figure 23:
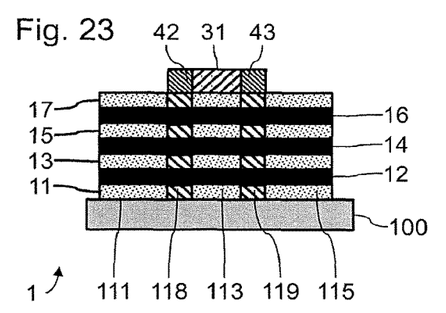
FIGS. 23 to 35 illustrate a transistor during various steps of its fabricating process, according to one example of a second embodiment of the invention.
Figure 24:
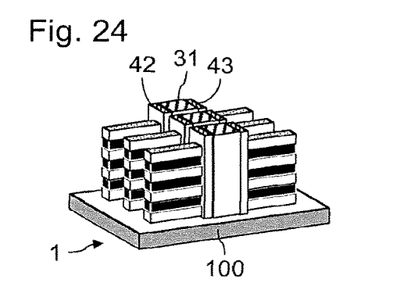

In FIGS. 23 and 24, the passivating material 34 has been removed in order to expose the ends of the nanowires 11 to 17. The internal spacers, the spacers 42 and 43 and the sacrificial gate 31 are preserved.

Figure 25:
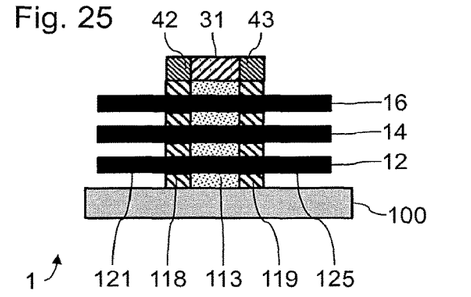
Figure 26:
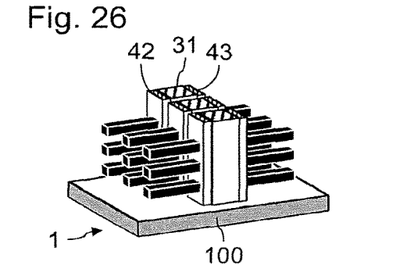

In FIGS. 25 and 26, the ends of the SiGe nanowires 11, 13, 15 and 17 have been removed. This removal of the ends is achieved selectively with respect to the ends of the nanowires 12, 14 and 16 made of silicon and with respect to the spacers and the sacrificial gate 31. The ends of the nanowires 12, 14 and 16 made of silicon are then relaxed.

Figure 27:
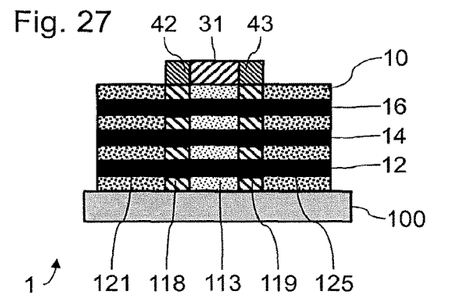
Figure 28:
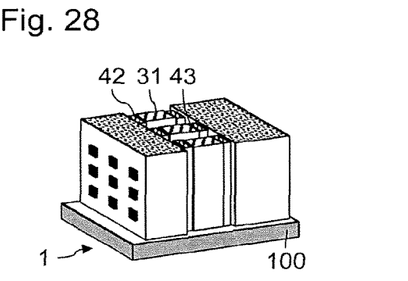

In FIGS. 27 and 28, an SiC:P deposit 10 has been formed by epitaxy on either side of the spacers 42 and 43. This deposit is formed around the ends of the nanowires 12, 14 and 16. The deposit 10 thus fills the voids obtained by selectively removing the ends of the SiGe nanowires 11, 13, 15 and 17. The presence of the ends of the nanowires 12, 14 and 16 promotes the growth of the deposit 10 epitaxially in a plurality of directions.

This deposit of SiC doped in situ with phosphorus allows, on the one hand, N-type dopants to be included in the source and drain of the nMOS transistor to be formed. On the other hand, because of its lattice parameter, the epitaxial growth of the SiC from the ends of the nanowires 12, 14 and 16 that remained exposed will induce a longitudinal tensile strain in these nanowires 12, 14 and 16. The longitudinal tensile strain in the median zone of the nanowires 12, 14 and 16 (corresponding to the channel zone of the nMOS transistor to be formed) is then increased.

Figure 29:
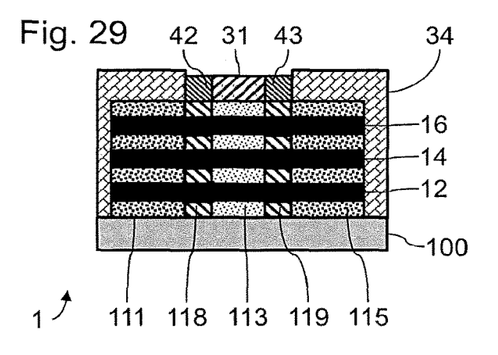
Figure 30:
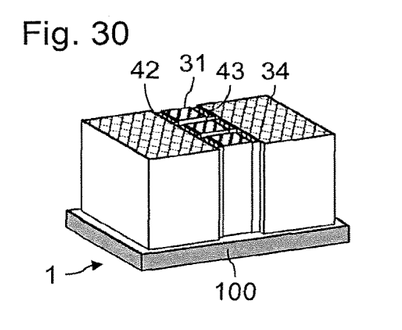

In FIGS. 29 and 30, the ends of the nanowires 12, 14 and 16 and the deposit 10 have been encapsulated in a passivating material 34.

Figure 31:
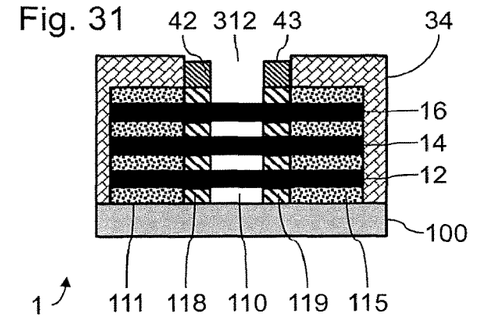
Figure 32:
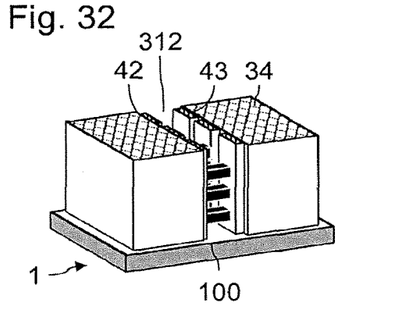

In FIGS. 31 and 32, the sacrificial gate 31 has been removed in order to produce a groove 312 and thus an access to the median portions of the nanowires 11 to 17. The removal of the sacrificial gate 31 has for example been achieved using an etch that is selective with respect to the material of the spacers 42 and 43.

The median portion of the nanowires 11, 13, 15 and 17 were then selectively etched while preserving the median portion of the nanowires 12, 14 and 16. The median portion of the nanowires 12, 14 and 16 (which corresponds to the channel zones of the gate-wrap-around transistor in the process of being formed) preserves its longitudinal tensile strain. Because voids have been formed in replacement of the median portions of the nanowires 11, 13, 15 and 17, an access to all the faces of the median portions of the nanowires 12, 14 and 16 is thus formed. The internal spacers 118 and 119, and the spacers 42 and 43 allow the intermediate portions of the nanowires 12, 14 and 16 to be protected during this selective etching of the SiGe of the median portions of the nanowires 11, 13, 15 and 17.

Figure 33:
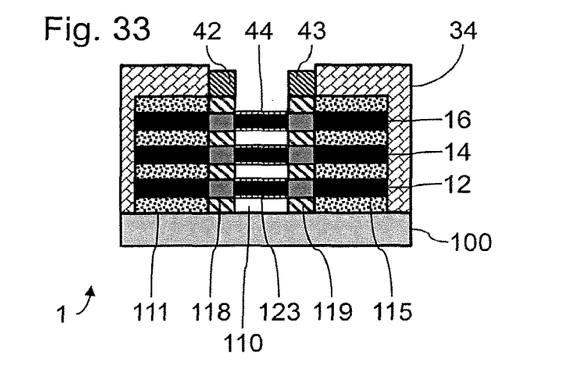

In FIG. 33, a gate insulator 44 has been formed around the median portions of the nanowires 12, 14 and 16. The gate insulator of each nanowire 12, 14 and 16 may for example comprise an interfacial oxide layer making contact with the nanowire, which layer is surmounted with an oxide layer wrapped around this interfacial layer. The wrap-around oxide layer may for example be made of $HfO_2$.

Figure 34:
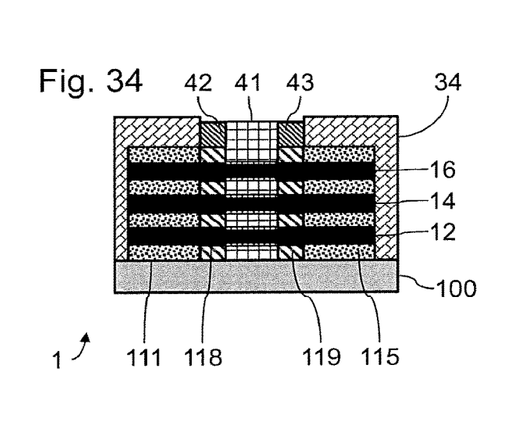
Figure 35:
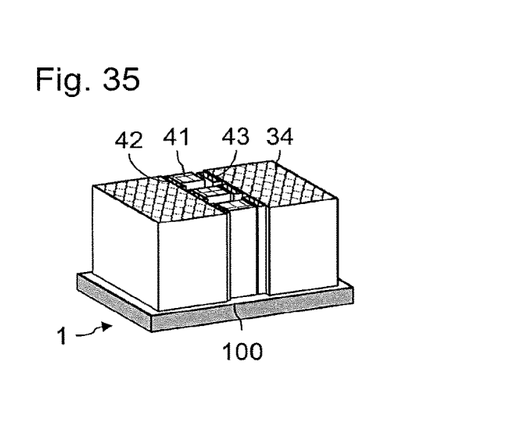

In FIGS. 34 and 35, a wrap-around gate 41 has been formed by filling the voids encircling the median portions of the nanowires 12, 14 and 16 and the gate insulators 44. The wrap-around gate 41 may for example be produced in a way known per se by depositing a gate metal or by depositing highly doped TIN or polysilicon.

In the described examples, the intermediate portions of the SiGe nanowires have been removed by ion implantation followed by etching. It is also possible to envisage removing the intermediate portions of sacrificial nanowires with an etch according to the crystal planes of these nanowires. For example, it is possible to carry out a chemical etch that etches at a high rate crystal planes of low density and at a low rate crystal planes that are denser. It is for example possible to etch crystal planes of SiGe with hydrochloric acid.

The described example includes a superposition of layers of silicon and of silicon-germanium with a view to creating channel zones that are strained with a longitudinal tensile strain. However, it is also possible to envisage other types of semiconductors in this superposition, provided that one of the semiconductors is suitable for forming the channel of a transistor, that its superposition with the other semiconductor induces tensile prestrains in the channel zone for an nMOS transistor (or compressive prestrains for a pMOS transistor), and that the two semiconductors can be etched selectively with respect to each other. It is also for example possible to envisage producing a superposition of nanowires of III-V type materials, for example of InAs and InGaAs. The superposition of the nanowires made include nanowires made of at least three different semiconductors.

The invention has essentially been described above in its application to an nMOS transistor. The invention may also be applied to a pMOS transistor. To do this, initially compressed SiGe may for example be formed by epitaxial growth of SiGe on relaxed Si (silicon-on-insulator or bulk-silicon substrate) then deposition of Si on this SiGe layer, optionally followed by an alternation of new deposits. It is then the median portion of the Si nanowires that will be removed, the median portions of the SiGe nanowires and their compressive strain being preserved.

In the example described above, the nanowires have a substantially square cross section. Other cross sections may of course be envisaged, for example ovoid, trapezoidal, or rectangular. Nanowires taking the form of nanosheets may for example be used, and thus have a cross section in which the width is at least equal to 2 times the height.

In the example described above, the superposition included seven nanowires. Provision may also be made for a superposition of any suitable number of nanowires at least equal to 2.

The invention claimed is:

1. A process for fabricating a gate-wrap-around field-effect transistor, comprising:
   providing a substrate surmounted with a superposition of first to third nanowires each having a median portion and first and second ends on either side of the median portion along a longitudinal axis thereof, each of the nanowires being made of a semiconductor, said second nanowire being disposed between the first and the third nanowires and being made of a semiconductor that is different from the semiconductor of the first nanowire and different from the semiconductor of the third nanowire, so that the second nanowire is subjected to a mechanical strain along its longitudinal axis, the median portion of the first to third nanowires being covered by a sacrificial gate;
   forming voids by removing a portion of the first and the third nanowires that is intermediate between their respective first end and their respective median portion, and by removing a portion of the first and the third nanowires that is intermediate between their respective second end and their respective median portion, while preserving the superposition of the first to the third nanowires level with the first and the second ends and under the sacrificial gate;
   forming an electrical insulator in said formed voids and around the second nanowire;
   removing the sacrificial gate and removing the median portion of the first and the third nanowires; and
   forming a gate electrode wrapped around the median portion of the second nanowire.

2. The process for fabricating a gate-wrap-around field-effect transistor according to claim 1, wherein the removing of the intermediate portions of the first and the third nanowires comprises a step of implanting ions into these intermediate portions and then a step of selectively etching these portions.

3. The process for fabricating a gate-wrap-around field-effect transistor according to claim 1, wherein the removing of the intermediate portions of the first and the third nanowires comprises etching the intermediate portions of the first and the third nanowires according to their crystal planes.

4. The process for fabricating a gate-wrap-around field-effect transistor according to claim 1, wherein the first to the third provided nanowires include silicon, and the first and the third nanowires include a proportion of germanium higher than that of the second nanowire.

5. The process for fabricating a gate-wrap-around field-effect transistor, according to claim 4, wherein the first and the third provided nanowires are made of $Si_{(1-x)}Ge_x$, where $0.2 < x < 0.6$.

6. The process for fabricating a gate-wrap-around field-effect transistor according to claim 1, further comprising a step of doping the second nanowire in a portion that is intermediate between its first end and its median portion and in a portion that is intermediate between its second end and its median portion, after the step of providing the substrate and before the step of removing the sacrificial gate.

7. The process for fabricating a gate-wrap-around field-effect transistor according to claim 1, further comprising, between the step of forming the electrical insulator and the step of removing the sacrificial gate, the steps of:
   removing the first and the second ends of the first and the third nanowires; and
   depositing a semiconductor that is different from that of the first to the third nanowires, by epitaxial growth from the first and the second ends of the second nanowire, so as to increase an amplitude of the mechanical strain in the median portion of the second nanowire.

8. The process for fabricating a gate-wrap-around field-effect transistor according to claim 7, wherein the material deposited by epitaxial growth is SiC doped in situ with phosphorus.

9. The process for fabricating a gate-wrap-around field-effect transistor according to claim 1, wherein the first to the third provided nanowires have a thickness at most equal to 15 nm.

10. The process for fabricating a gate-wrap-around field-effect transistor according to claim 1, wherein the provided substrate includes sacrificial spacers covering a portion of the first to the third nanowires on either side of the sacrificial gate, the process further comprising a step of removing the sacrificial spacers prior to the forming of the voids.

11. The process for fabricating a gate-wrap-around field-effect transistor according to claim 1, wherein the removed portions of the first and the third nanowires each have a length comprised between 3 nm and 15 nm.

12. The process for fabricating a gate-wrap-around field-effect transistor according to claim 1, further comprising a step of forming spacers wrapped around the electrical insulator on either side of the median portion of the second nanowire.

* * * * *